(12) United States Patent
Wang et al.

(10) Patent No.: US 7,235,852 B2
(45) Date of Patent: Jun. 26, 2007

(54) INTEGRATED VARIABLE OPTICAL ATTENUATOR

(75) Inventors: Steve Wang, San Jose, CA (US); Xuejun Lu, Fremont, CA (US); Frank Levinson, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 92 days.

(21) Appl. No.: 10/762,913

(22) Filed: Jan. 22, 2004

(65) Prior Publication Data
US 2005/0045981 A1 Mar. 3, 2005

Related U.S. Application Data

(60) Provisional application No. 60/498,745, filed on Aug. 28, 2003.

(51) Int. Cl.
*H01L 31/0232* (2006.01)
(52) U.S. Cl. ...................... 257/458; 257/432; 257/460; 257/461; 438/48; 438/65

(58) Field of Classification Search ................ 257/324, 257/333, 332, 431, 464, 184, 436, 388, 53, 257/458
See application file for complete search history.

(56) References Cited

U.S. PATENT DOCUMENTS

| | | | | |
|---|---|---|---|---|
| 5,475,256 A | * | 12/1995 | Sawada et al. | ............. 257/577 |
| 5,973,339 A | * | 10/1999 | Yokouchi et al. | ........... 257/184 |
| 6,577,654 B1 | * | 6/2003 | Dijaili et al. | ................. 372/20 |
| 6,813,431 B2 | * | 11/2004 | Davids et al. | ............. 385/129 |
| 2003/0161571 A1 | * | 8/2003 | Davids et al. | ................ 385/14 |

FOREIGN PATENT DOCUMENTS

WO WO97/08757 * 6/1997

* cited by examiner

*Primary Examiner*—Evan Pert
*Assistant Examiner*—Fazli Erdem
(74) *Attorney, Agent, or Firm*—Workman Nydegger

(57) ABSTRACT

A variable optical attenuator. A PIN structure is integrated with an optical detector such as a PIN diode or an APD diode. When the PIN structure is forward biased, the light signal is not affected and is detected by the optical detector. When the PIN structure is reverse biased, the light signal is attenuated and the dynamic range of the optical detector can be increased.

12 Claims, 3 Drawing Sheets

INTEGRATED VARIABLE OPTICAL ATTENUATOR

This application claims the benefit of U.S. Provisional Application Ser. No. 60/498,745 filed Aug. 28, 2003, which is incorporated by reference.

BACKGROUND OF THE INVENTION

1. The Field of the Invention

The present invention relates to optical transceivers. More specifically, the present invention relates to a variable attenuator for use in optical transceivers and more particularly to a dual pin photodiode that variably attenuates an incident optical signal.

2. Background and Relevant Art

One of the ways that information is transmitted and received over networks is through the use of optical signals. One of the processes that enables data to be transferred using optical signals is signal demodulation. Demodulation is the process of retrieving the data from a modulated optical signal. Demodulation is not a simple process as the modulated optical signals can undergo, for example, attenuation and optical dispersion. Demodulation is further complicated by noise that is often added to the modulated optical signals by optical amplifiers or by a variety of other sources.

An optical transceiver begins demodulating the data in a modulated optical signal by converting the optical signal to an electrical signal or current. Next, the optical transceiver typically filters the electrical signal, performs clock recovery, equalizes the electrical signal, and the like in order to recover the data.

An optical transceiver has a dynamic range that refers to optical signals that can be successfully received and demodulated. The optical sensitivity of the optical transceiver is associated with low optical power. Optical signals having an incident optical power below the optical sensitivity may have an unacceptably high bit error rate. The other end of the dynamic range may be referred to as the saturation power and incident optical signals having too much optical power are not successfully modulated because the transceiver saturates. In other words, the optical sensitivity and saturation power identify a range of signals that can be successfully processed by the optical transceiver.

In a transceiver, a detector converts the incident optical signal to an electrical current and therefore has an impact on the dynamic range of the transceiver. A detector, for instance, generates an electrical current that is related to the optical power of the incident optical signal. When the optical power of the incident optical signal is too great, the transceiver saturates.

One solution to the problem of exceeding the saturation power of the transceiver is to add external attenuators to the optical transceiver. In this situation, it is likely that some architecture or system design work will be required to determine where an attenuator is needed in the system and how much attenuation is required. Once this information is decided, the installation of the external attenuators will need to be performed. In addition to raising cost, the use of external attenuators adds extra components to an optical network.

BRIEF SUMMARY OF THE INVENTION

These and other limitations are overcome by the present invention, which relates to systems and methods for automatically attenuating an optical signal. More particularly, the present invention relates to variable attenuators that are integrated with an optical transceiver. One advantage of the present invention is that the dynamic range of an optical transceiver can be increased to accommodate optical signals with higher optical power without having a corresponding effect on the optical sensitivity of the transceiver.

The dynamic range of a transceiver is increased, in one embodiment, by integrating an attenuating layer with the detector of the transceiver. The attenuating layer operates by attenuating the incident optical signal when the optical power of the optical signal increases. A control module such as a processor can be used to sample and monitor the optical power of the incident signal. As the optical power increases, the attenuating layer can be used to attenuate the optical signal by a fixed amount. Alternatively,. the attenuating layer can be used to variably attenuate the optical signal. The attenuation of the optical signal is dependent on the incident optical power in one embodiment. Advantageously, the attenuation can be either fixed or variable.

In one embodiment, the attenuating layer is a PIN structure that is similar to a PIN photodiode. The PIN structure is placed or formed on the detector such that the incident optical signal passes through the PIN structure. The PIN structure is forward biased such that the PIN structure is transparent to the optical signal. As a result, the optical sensitivity of the transceiver is unaffected. When the optical power increases, the bias of the PIN structure is changed such that the PIN structure is reverse biased. In this case, some of the incident optical signal is absorbed. Thus, the dynamic range of the transceiver is increased because the transceiver can successfully process optical signals that it would otherwise be unable to process without exceeding the saturation power of the optical transceiver.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to systems and methods for detecting optical signals. More particularly, the present invention relates to systems and methods for attenuating optical signals. In one embodiment, the present invention is integrated optical attenuation with optical detection. By combining optical attenuation with optical detection, the dynamic range of the detector and/or the transceiver is increased. Also, the need for external attenuation is eliminated. In other words, the present invention relates to an integrated receiver solution that reduces or eliminates the susceptibility of an optical transceiver to saturation from high optical power signals.

Photodiodes are commonly used as detectors for optical signals. The photodiode generates a current that is related to the power of the detected optical signal. However, too much optical power may saturate a detector. In one embodiment of the present invention, an attenuating layer is integrated with the detector. At typical levels of optical power, the attenuating layer is transparent to the optical signal. At higher levels of optical power, the attenuating layer attenuates the optical signal such that saturation is prevented in many instances.

As described in more detail below for one embodiment of the invention, the attenuating layer is a PIN structure that is grown before the growth of an avalanche photodiode (APD) or a PIN diode. At normal optical power levels, the PIN structure is forward biased such that it is transparent. At higher optical power levels, the PIN structure is reversed biased such that optical absorption occurs, thereby attenuating the optical signal that is detected by the APD diode or the PIN diode.

Figure 1:
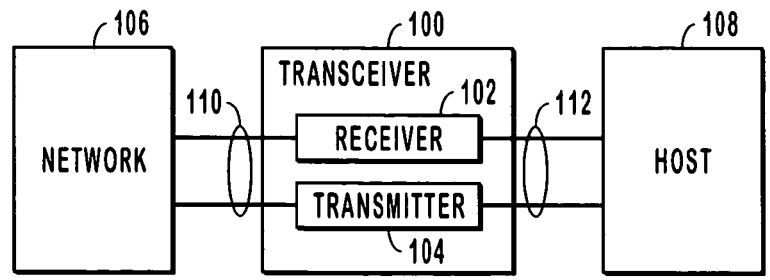
FIG. 1 illustrates an exemplary environment for implementing embodiments of the present invention.

FIG. 1 illustrates an exemplary environment for implement embodiments of the present invention. FIG. 1 illustrates a transceiver 100 that enables a host 108 to connect with a network 106. In this example, the transceiver 100 connects to the network 106 over fiber optics 110. The transceiver 100 connects with the host 108 over an electrical connection 112.

The transceiver 100 includes a transmitter 104 that receives an electrical signal from the host 108, converts the electrical signal to an optical signal and transmits the optical signal over into the fiber optics 110. The transceiver also includes a receiver 102 that receives optical signals over the fiber optics 110, converts the optical signals to electrical signals that are then presented to the host 108. The fiber optics 110 includes single mode optical fibers, multi-mode optical fibers, and any other fiber or cable capable of carrying an optical signal.

The receiver 102 typically has a dynamic range that determines what type of signals can be successfully detected by the receiver 102. The dynamic range is often represented in terms of power and optical signals. The optical sensitivity of the receiver 102 is lower limit at which the receiver 102 still has an acceptable error rate. Optical power below the lower limit typically results in an unacceptable error rate. When the incoming optical power of the optical signal is too strong, the receiver 102 saturates and results in errors as previously stated.

Figure 2:
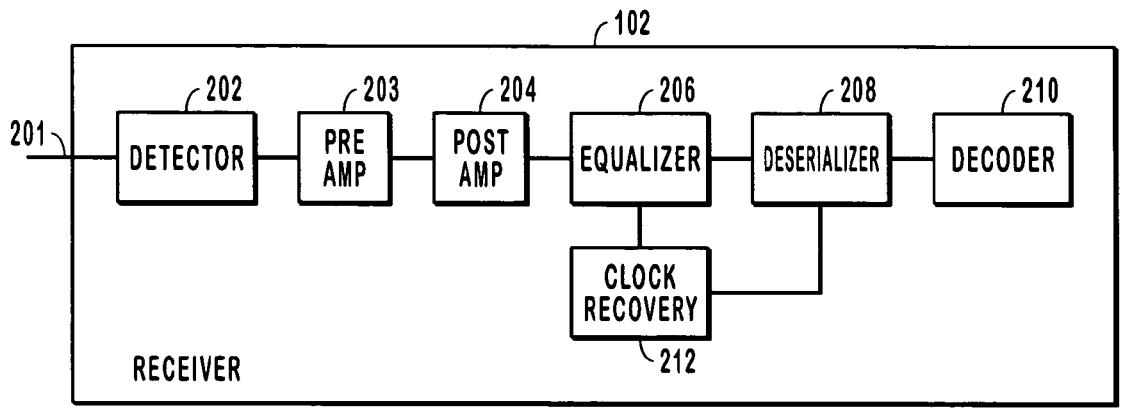
FIG. 2 illustrates a functional block diagram of a receiver that may be included in an optical transceiver.

FIG. 2 illustrates one embodiment of a receiver 102 that is included in a transceiver. In FIG. 2, the incoming optical signal 201 is detected by a detector 202. The output of the detector 202 is typically a current that represents the optical signal. As previously stated, if the optical signal 201 has excessive optical power, then the receiver 102 saturates and an error occurs. The output of the detector 202 passes through a pre Amp stage 203 and a post Amp stage 204. Next, the signal is processed by an equalizer 206, a deserializer 208, and a clock recovery 212 in this embodiment. Finally, the signal is decoded 210 and provided to the host.

Figures 3A, 3B:
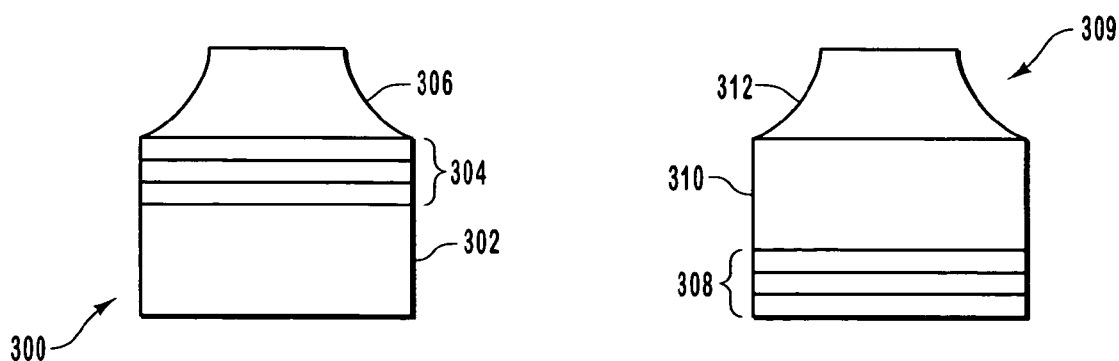
FIG. 3A illustrates one embodiment of a detector that includes an attenuating layer formed next to a detecting layer.
FIG. 3B illustrates another embodiment of a detector where a substrate is between the attenuating layer and the detecting layer.

As previously discussed, a PIN photodiode or an avalanche photodiode is typically used as the detector 202 and external attenuators are typically needed to prevent the receiver from optically saturating. FIG. 3A and FIG. 3B illustrate embodiments of a detector that increases the dynamic range of the receiver 102 and permits the receiver to process optical signals having more optical power without generating an error. Advantageously, the present invention obviates the need for external attenuators that provide fixed attenuation or variable attenuation.

FIG. 3A illustrates a detector 300 having a structure that enables an optical signal to be attenuated automatically. The detector 300 includes a diode layer 306, an attenuation layer 304 and a substrate 302. In FIG. 3A, the attenuation layer 304 is between the diode layer 306 and the substrate 302. FIG. 3B, which illustrates another embodiment of the present invention, also includes a diode layer 312, a substrate 310, and an attenuation layer 308. In the embodiment of FIG. 3B, however, the substrate 310 is between the diode layer 312 and the attenuation layer 308.

The diode layer may be, for example, a PIN photodiode, an avalanche photodiode, or any other component that converts an optical signal to a current or voltage. The substrate may be a semi-insulating substrate formed, for example, from InP or other substrate materials known to one of skill in the art.

In one embodiment, the attenuation layer is a p-i-n (positive-intrinsic-negative or PIN) structure that is similar to a PIN photodiode. The PIN structure, which is one embodiment of the attenuation layer, can be used to attenuate light that has excessive power without adversely impacting the optical sensitivity of the receiver. This enlarges the dynamic range of the detector. When the optical signal that is incident on the detector has low or weak optical power, the attenuation layer or PIN structure is forward biased. When the PIN structure is forward biased, the carrier density of the I layer is above the transparent carrier density of the intrinsic semiconductor. As a result, there is no optical absorption in the attenuation layer and the optical sensitivity of the receiver or of the detector is not affected.

Figure 4:
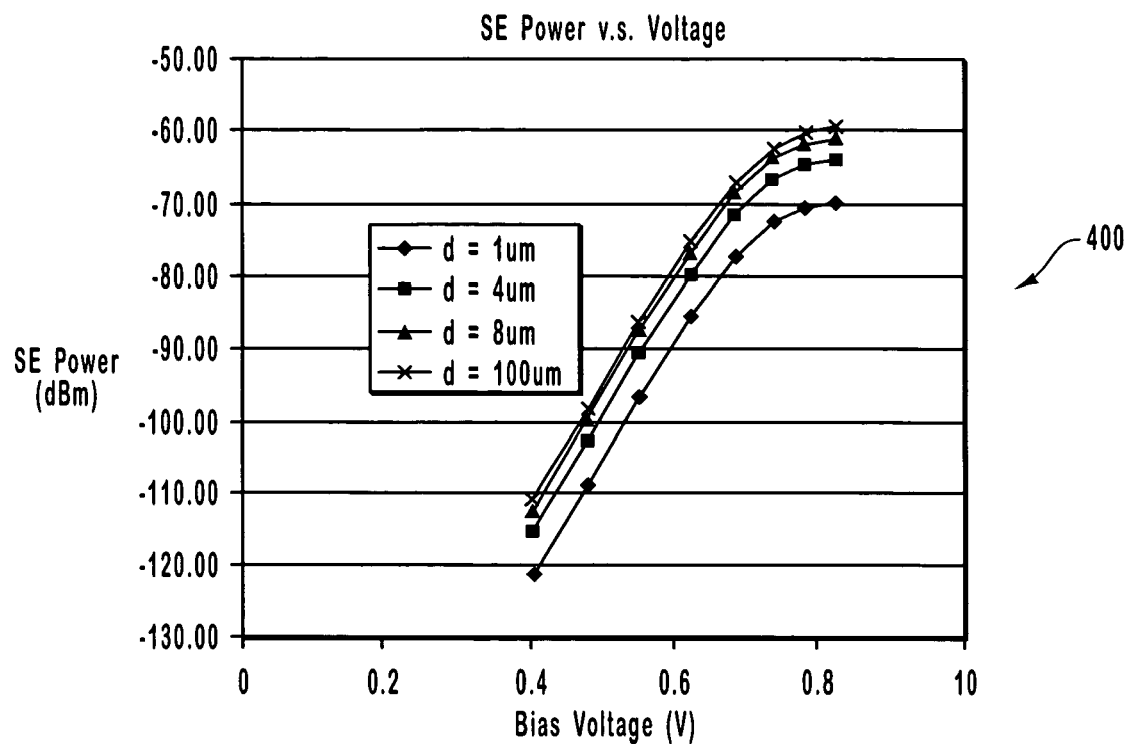
FIG. 4 is a plot that illustrates the light intensity of an attenuating layer versus a bias voltage.

When the PIN structure is forward biased, the PIN structure may operate as a low power light emitting diode (LED). The emitting power, however, is very low and does not impact the detector. This is illustrated in FIG. 4 which illustrates a plot 400 of the emitting power versus the bias voltage of the PIN structure.

Figure 5:
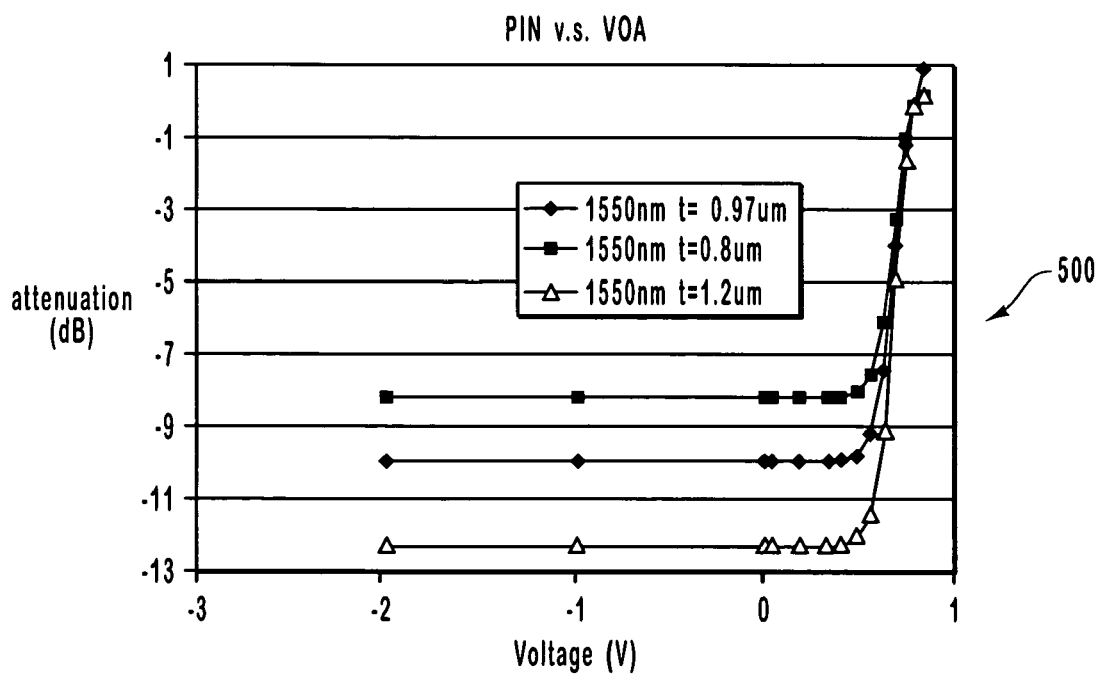
FIG. 5 is a plot that illustrates examples the attenuation as a function of bias voltage.

When the PIN structure is reverse biased, however, the PIN structure absorbs the incoming optical signal due to optical absorption. Because the PIN structure is able to absorb some of the incoming optical signal, optical signals that normally saturate the receiver can now be processed without saturating the receiver. FIG. 5 illustrates a graph 500 that tracks the attenuation of the incoming optical signal versus the voltage. The PIN structure can thus be used as a variable optical attenuator. The plots 502, 504, and 506 illustrate that the thickness of the intrinsic layer of the PIN structure has an impact on the attenuation of the optical signal.

Figure 6:
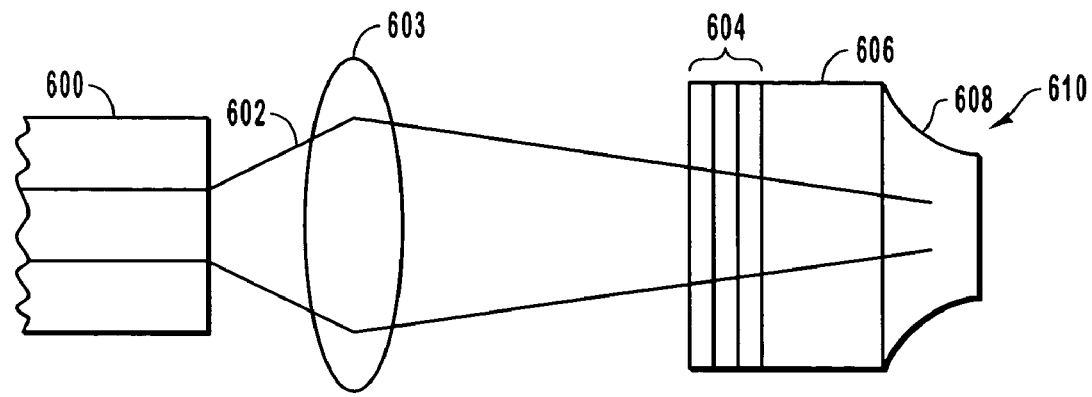
FIG. 6 is a block diagram that illustrates one embodiment of a detector that includes an attenuating layer for attenuating an incident optical signal.

FIG. 6 illustrates a detector that receives an incoming optical signal. In FIG. 6, an optical fiber 600 is carrying an optical signal 602. As the optical signal 602 exits the optical fiber 600, the focusing optics 603 (which may be one or more lenses, for example) focus the optical signal 602 on the diode layer 608 of the detector 610. The optical signal, however, passes through the attenuating layer 604 and the substrate 606 in this example. Typically, the optical signal is not focused on the attenuating layer 604.

Figure 7:
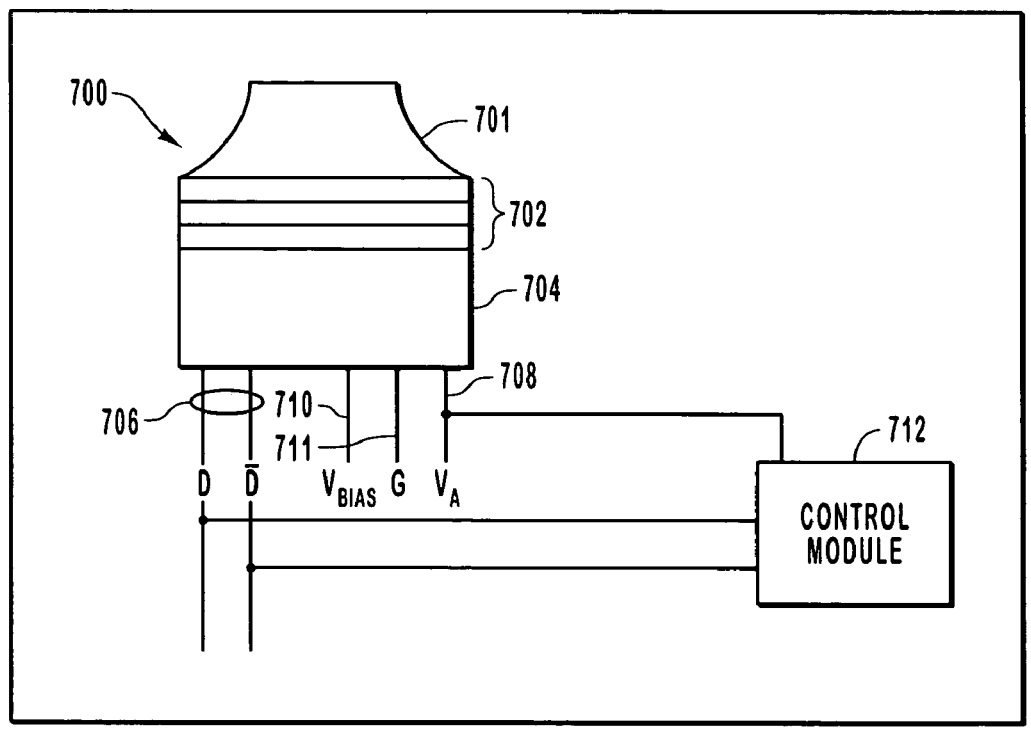
FIG. 7 illustrates one embodiment of a module that controls a bias voltage of an attenuating layer.

FIG. 7 illustrates one embodiment of a system for controlling a bias voltage of the attenuating layer. The detector 700 includes a diode layer 701, an attenuating layer (illustrated as a PIN structure 702 in this embodiment) and a substrate 704 as previously described. The pins 706 are used to detect the data received through the detector 700. The pin 710 provides a bias voltage for the diode layer 701. The pin 711 is ground. The pin 708 is a pin used to apply a bias voltage to the PIN structure 702. During operation, the optical power of the injected optical signal is sensed and provided to the control module 712, which is a microprocessor in one embodiment.

As the optical power of the injected optical signal increases or as the optical power reaches a predetermined threshold power, the control module 712 adjusts the bias voltage applied to the PIN structure 702 through the pin 708 such that the PIN structure 702 becomes reverse biased and begins to absorb a portion of the injected optical signal,. thereby reducing the optical power such that the receiver is not saturated. As the optical power of the injected optical signal decreases, the voltage bias applied to the PIN structure is adjusted such that PIN structure is forward biased and becomes transparent to the injected optical signal. In this manner, the PIN structure becomes a variable optical attenuator and has the advantage of extending the dynamic range of the receiver.

In one embodiment, the PIN structure is used as a variable optical attenuator when the bias voltage applied by the control module 712 is related to the optical intensity. The applied bias voltage is dependent on the incident optical signal. Alternatively, the PIN structure 702 can be used as a fixed attenuator. In this case, a particular bias voltage is applied as long as the incident optical power exceeds a predetermined threshold. When the incident optical power drops below the threshold, the reverse bias is removed such that the incident optical signal is no longer attenuated.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In a system that receives an optical signal, a detector that attenuates the optical signal based on an optical power of the optical signal, the detector comprising:
    a detecting layer that receives an incident optical signal and generates a current that is related to an optical power of the incident optical signal;
    a PIN structure connected to the detecting layer such that the incident optical signal passes through the PIN structure before the detecting layer; and
    a control module that monitors the optical power of the incident optical signal detected by the detecting layer, wherein the control module generates a bias voltage to reverse bias the PIN structure when the optical power exceeds a threshold such that the incident optical signal is attenuated by the PIN structure before being detected by the detecting layer.

2. A detector as defined in claim 1, wherein the detecting layer is a PIN diode or an APD diode.

3. A detector as defined in claim 1, wherein an I layer of the PIN structure has a thickness, wherein an attenuation of the incident optical signal is related to the thickness of the I layer.

4. A detector as defined in claim 1, wherein the detecting layer is formed on a first side of a substrate and the PIN structure is formed on a second side of the substrate.

5. A detector as defined in claim 1, wherein the PIN structure is formed on a substrate and the detecting layer is formed on the PIN structure.

6. A detector as defined in claim 1, wherein the control module controls the bias voltage such that the PIN structure is forward biased when the optical power is below the threshold.

7. A detector as defined in claim 1, wherein the control module varies a magnitude of the bias voltage according to the optical power such that the optical signal is variably attenuated.

8. A detector as defined in claim 1, further comprising a lens to focus the incident optical signal on the detecting layer.

9. A method for variably attenuating an optical signal, the method comprising:
    receiving an optical signal with a detector such that the optical signal is focused on a detecting diode of the detector, wherein the optical signal passes through a PIN structure of the detector before being focused on the detecting diode;
    monitoring an optical power of the optical signal;
    applying a forward bias to the PIN structure when the optical power is below a threshold; and
    applying a reverse bias to the PIN structure when the optical power exceeds the threshold such that the optical signal is partially absorbed.

10. A method as defined in claim 9, wherein reverse biasing the PIN structure when the optical power exceeds the threshold such that the optical signal is partially absorbed further comprises controlling a bias voltage that is applied to the PIN structure.

11. A method as defined in claim 10, wherein controlling the bias voltage that is applied to the PIN structure further comprises:
    increasing the bias voltage as the optical power increases past the threshold such that the reverse bias increases to variably attenuate the incident optical signal;
    decreasing the bias voltage as the optical power decreases toward the threshold; and
    applying a forward bias to the PIN structure when the optical power drops below the threshold.

12. A method as defined in claim 9, wherein applying a reverse bias to the PIN structure when the optical power exceeds the threshold such that the optical signal is partially absorbed farther comprises adjusting the reverse bias such that the detector is not saturated by the incident optical signal.

* * * * *

UNITED STATES PATENT AND TRADEMARK OFFICE
CERTIFICATE OF CORRECTION

PATENT NO. : 7,235,852 B2  Page 1 of 1
APPLICATION NO. : 10/762913
DATED : June 26, 2007
INVENTOR(S) : Wang et al.

It is certified that error appears in the above-identified patent and that said Letters Patent is hereby corrected as shown below:

Column 2
Line 15, after "Alternatively,", remove [.]

Column 5
Line 3, remove [502, 504, 506]

Signed and Sealed this

Twenty-seventh Day of July, 2010

David J. Kappos
*Director of the United States Patent and Trademark Office*